(12) United States Patent
Tran et al.

(10) Patent No.: US 12,062,397 B2
(45) Date of Patent: Aug. 13, 2024

(54) TRANSCEIVER FOR PROVIDING HIGH VOLTAGES FOR ERASE OR PROGRAM OPERATIONS IN A NON-VOLATILE MEMORY SYSTEM

(71) Applicant: Silicon Storage Technology, Inc., San Jose, CA (US)

(72) Inventors: Hieu Van Tran, San Jose, CA (US); Anh Ly, San Jose, CA (US); Kha Nguyen, Ho Chi Minh (VN); Hien Pham, Ho Chi Minh (VN); Duc Nguyen, Ho Chi Minh (VN)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 75 days.

(21) Appl. No.: 17/585,261

(22) Filed: Jan. 26, 2022

(65) Prior Publication Data
US 2023/0141943 A1 May 11, 2023

Related U.S. Application Data

(60) Provisional application No. 63/276,842, filed on Nov. 8, 2021.

(51) Int. Cl.
*G11C 16/16* (2006.01)
*G11C 16/10* (2006.01)
*G11C 16/26* (2006.01)
*G11C 16/30* (2006.01)

(52) U.S. Cl.
CPC ............ *G11C 16/16* (2013.01); *G11C 16/102* (2013.01); *G11C 16/26* (2013.01); *G11C 16/30* (2013.01)

(58) Field of Classification Search
CPC ....... G11C 16/16; G11C 16/102; G11C 16/26; G11C 16/30; G11C 16/0425; G11C 5/147
See application file for complete search history.

(56) References Cited

U.S. PATENT DOCUMENTS

| | | | |
|---|---|---|---|
| 5,029,130 A | 7/1991 | Yeh | |
| 5,812,463 A * | 9/1998 | Park | G11C 16/12 365/185.23 |
| 6,072,358 A | 6/2000 | Hung et al. | |
| 6,747,310 B2 | 6/2004 | Fan | |
| 7,180,329 B1 * | 2/2007 | Sia | H03K 3/356113 326/83 |
| 7,339,832 B2 | 3/2008 | Lambrache | |
| 7,460,411 B2 | 12/2008 | Lambrache | |
| 9,692,394 B1 * | 6/2017 | Agrawal | H03K 19/0005 |
| 2003/0090311 A1 | 5/2003 | Pan | |

OTHER PUBLICATIONS

PCT Search Report and Written Opinion dated Jul. 7, 2022 corresponding to the related PCT Patent Application No. US2022/14744.
Taiwanese Office Action dated Oct. 13, 2023 corresponding to the related Taiwanese Patent Application No. 111138125.

* cited by examiner

*Primary Examiner* — Sultana Begum
(74) *Attorney, Agent, or Firm* — DLA PIPER LLP US

(57) ABSTRACT

Numerous embodiments of a transceiver for providing high voltages for use during erase or program operations in a non-volatile memory system are disclosed. In one embodiment, a transceiver comprises a PMOS transistor and a native NMOS transistor. In another embodiment, a transceiver comprises a PMOS transistor, an NMOS transistor, and a native NMOS transistor.

12 Claims, 16 Drawing Sheets

TRANSCEIVER FOR PROVIDING HIGH VOLTAGES FOR ERASE OR PROGRAM OPERATIONS IN A NON-VOLATILE MEMORY SYSTEM

PRIORITY CLAIM

This application claims priority from U.S. Provisional Patent Application No. 63/276,842, filed on Nov. 8, 2021, and titled, "High Voltage Transceiver for Non-Volatile Memory System," which is incorporated by reference herein.

FIELD OF THE INVENTION

Numerous embodiments of a transceiver for providing high voltages for erase or program operations in a non-volatile memory system are disclosed.

BACKGROUND OF THE INVENTION

Non-volatile memories are well known. For example, U.S. Pat. No. 5,029,130 ("the '130 patent"), which is incorporated herein by reference, discloses an array of split gate non-volatile memory cells, which are a type of flash memory cells. Such a memory cell 110 is shown in FIG. 1. Each memory cell 110 includes source region 14 and drain region 16 formed in semiconductor substrate 12, with channel region 18 there between. Floating gate 20 is formed over and insulated from (and controls the conductivity of) a first portion of the channel region 18, and over a portion of the source region 14. Word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline 24 is coupled to drain region 16.

Memory cell 110 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim (FN) tunneling.

Memory cell 110 is programmed by source side injection (SSI) with hot electrons (where electrons are placed on the floating gate) by placing a positive voltage on the word line terminal 22, and a positive voltage on the source region 14. Electron current will flow from the drain region 16 towards the source region 14. The electrons will accelerate and become heated when they reach the gap between the word line terminal 22 and the floating gate 20. Some of the heated electrons will be injected through the gate oxide onto the floating gate 20 due to the attractive electrostatic force from the floating gate 20.

Memory cell 110 is read by placing positive read voltages on the drain region 16 and word line terminal 22 (which turns on the portion of the channel region 18 under the word line terminal). If the floating gate 20 is positively charged (i.e. erased of electrons), then the portion of the channel region 18 under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state.

Table No. 1 depicts typical voltage and current ranges that can be applied to the terminals of memory cell 110 for performing read, erase, and program operations:

TABLE NO. 1

| Operation of Flash Memory Cell 110 of FIG. 1 | | | |
|---|---|---|---|
| | WL | BL | SL |
| Read | 2-3 V | 0.6-2 V | 0 V |
| Erase | ~11-13 V | 0 V | 0 V |
| Program | 1-2 V | 10.5-3 µA | 9-10 V |

Other split gate memory cell configurations, which are other types of flash memory cells, are known.

For example, FIG. 2 depicts a four-gate memory cell 210 comprising source region 14, drain region 16, floating gate 20 over a first portion of channel region 18, a select gate 22 (typically coupled to a word line, WL) over a second portion of the channel region 18, a control gate 28 over the floating gate 20, and an erase gate 30 over the source region 14. This configuration is described in U.S. Pat. No. 6,747,310, which is incorporated herein by reference for all purposes. Here, all gates are non-floating gates except floating gate 20, meaning that they are electrically connected or connectable to a voltage source. Programming is performed by heated electrons from the channel region 18 injecting themselves onto the floating gate 20. Erasing is performed by electrons tunneling from the floating gate 20 to the erase gate 30.

Table No. 2 depicts typical voltage and current ranges that can be applied to the terminals of memory cell 210 for performing read, erase, and program operations:

TABLE NO. 2

| Operation of Flash Memory Cell 210 of FIG. 2 | | | | | |
|---|---|---|---|---|---|
| | WL/SG | BL | CG | EG | SL |
| Read | 1.0-2 V | 0.6-2 V | 0-2.6 V | 0-2.6 V | 0 V |
| Erase | −0.5 V/0 V | 0 V | 0 V/−8 V | 8-12 V | 0 V |
| Program | 1 V | 0.1-1 µA | 8-11 V | 4.5-9 V | 4.5-5 V |

FIG. 3 depicts a three-gate memory cell 310, which is another type of flash memory cell. Memory cell 310 is identical to the memory cell 210 of FIG. 2 except that memory cell 310 does not have a separate control gate. The erase operation (whereby erasing occurs through use of the erase gate) and read operation are similar to that of the memory cell 210 of FIG. 2 except there is no control gate bias applied. The programming operation also is done without the control gate bias, and as a result, a higher voltage must be applied on the source line during a program operation to compensate for a lack of control gate bias.

Table No. 3 depicts typical voltage and current ranges that can be applied to the terminals of memory cell 310 for performing read, erase, and program operations:

TABLE NO. 3

| Operation of Flash Memory Cell 310 of FIG. 3 | | | |
|---|---|---|---|
| | WL/SG | BL | EG | SL |
| Read | 0.7-2.2 V | 0.6-2 V | 0-2.6 V | 0 V |
| Erase | −0.5 V/0 V | 0 V | 11.5 V | 0 V |
| Program | 1 V | 0.2-3 µA | 4.5 V | 7-9 V |

FIG. 4 depicts stacked gate memory cell 410, which is another type of flash memory cell. Memory cell 410 is similar to memory cell 110 of FIG. 1, except that floating gate 20 extends over the entire channel region 18, and control gate 22 (which here will be coupled to a word line) extends over floating gate 20, separated by an insulating layer (not shown). The erase is done by FN tunneling of electrons from FG to substrate, programming is by channel hot electron (CHE) injection at region between the channel 18 and the drain region 16, by the electrons flowing from the source region 14 towards to drain region 16 and read operation which is similar to that for memory cell 110 of FIG. 1 with a higher control gate voltage.

Table No. 4 depicts typical voltage ranges that can be applied to the terminals of memory cell 410 and substrate 12 for performing read, erase, and program operations on memory cell 410:

TABLE NO. 4

Operation of Flash Memory Cell 410 of FIG. 4

|  | CG | BL | SL | Substrate |
|---|---|---|---|---|
| Read | 2-5 V | 0.6-2 V | 0 V | 0 V |
| Erase | −8 to −10 V/0 V | FLT | FLT | 8-10 V/15-20 V |
| Program | 8-12 V | 3-5 V | 0 V | 0 V |

Other non-volatile memory cells are known, such as FINFET split gate flash or stack gate flash memory, NAND flash, SONOS (silicon-oxide-nitride-oxide-silicon, charge trap in nitride), MONOS (metal-oxide-nitride-oxide-silicon, metal charge trap in nitride), ReRAM (resistive ram), PCM (phase change memory), MRAM (magnetic ram), FeRAM (ferroelectric RAM), CT (charge trap) memory, CN (carbon-tube) memory, OTP (bi-level or multi-level one time programmable), and CeRAM (correlated electron RAM).

As shown above, non-volatile memory systems often require high voltages (e.g., voltages greater than the core voltage, Vdd, of the non-volatile memory array, such as 3.3V or 5.0V) for program and erase operations. Numerous techniques exist in the prior art for generating such high voltages and providing them to the appropriate memory cell terminals during a program or erase operation. These techniques sometimes utilize high voltage generation and transceiver circuits. High voltage generation and transceiver circuits consume significant amounts of power within a non-volatile memory system.

There is a need for an improved high voltage generation and transceiver circuit that consumes less power than prior art circuits.

SUMMARY OF THE INVENTION

Numerous embodiments of a transceiver for providing high voltages for use during erase or program operations in a non-volatile memory system are disclosed. In one embodiment, a transceiver comprises a PMOS transistor and a native NMOS transistor. In another embodiment, a transceiver comprises a PMOS transistor, an NMOS transistor, and a native NMOS transistor.

DETAILED DESCRIPTION OF THE INVENTION

Figure 5:
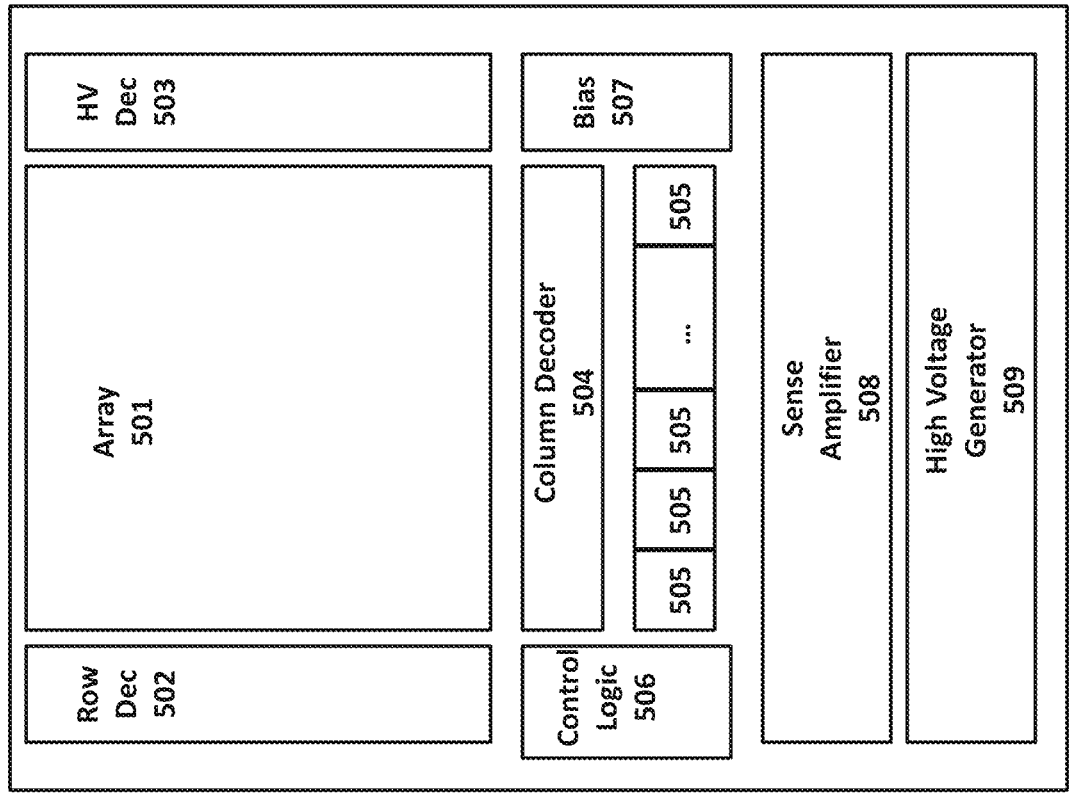
FIG. 5 depicts a non-volatile memory system.

FIG. 5 depicts non-volatile memory system 500. Non-volatile memory system 500 comprises array 501, row decoder 502, high voltage decoder 503, column decoders 504, bit line drivers 505, control logic 506, bias generator 507, sense amplifier 508, and high voltage generator 509.

Figure 1:
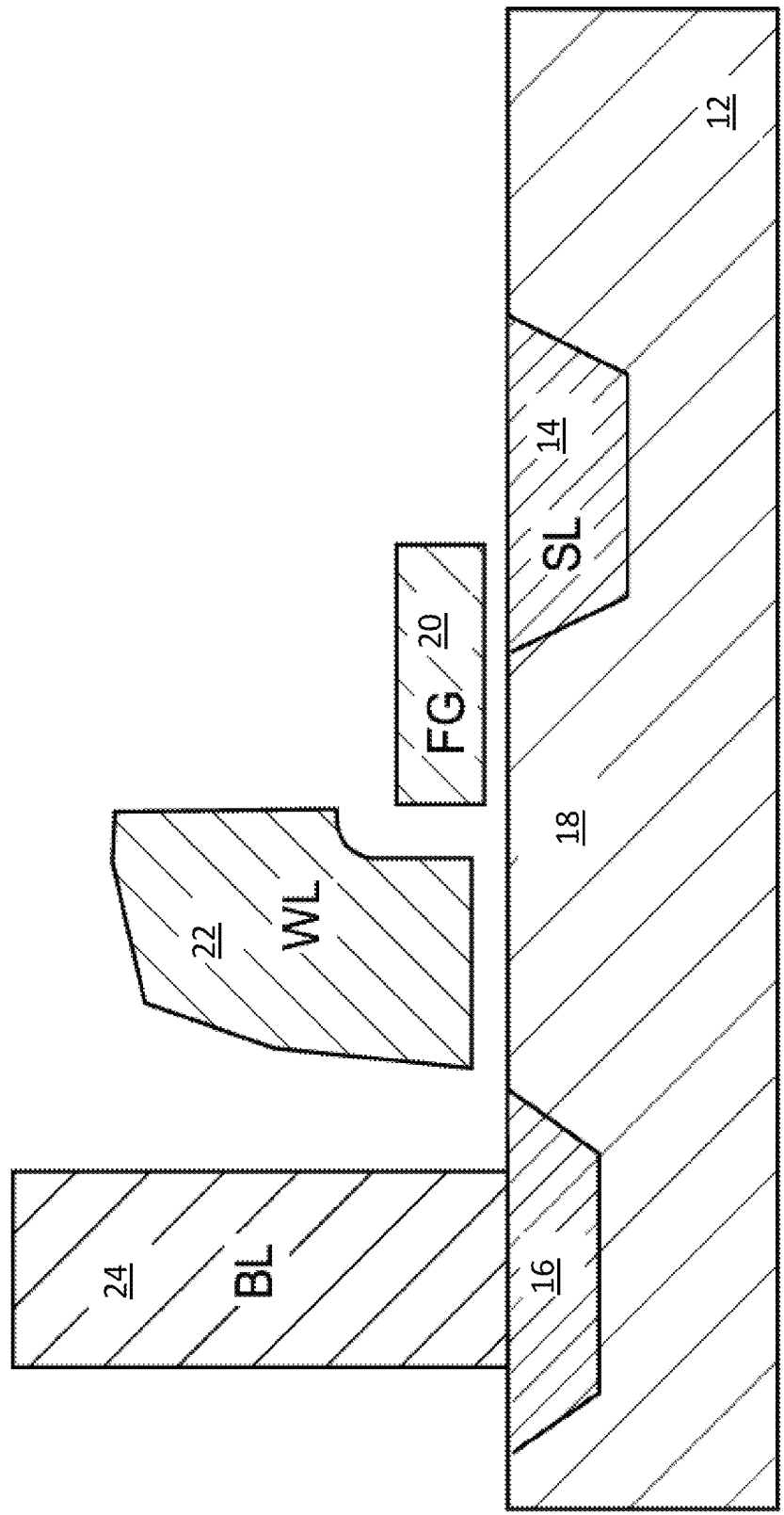
FIG. 1 depicts a prior art split gate flash memory cell.
Figure 2:
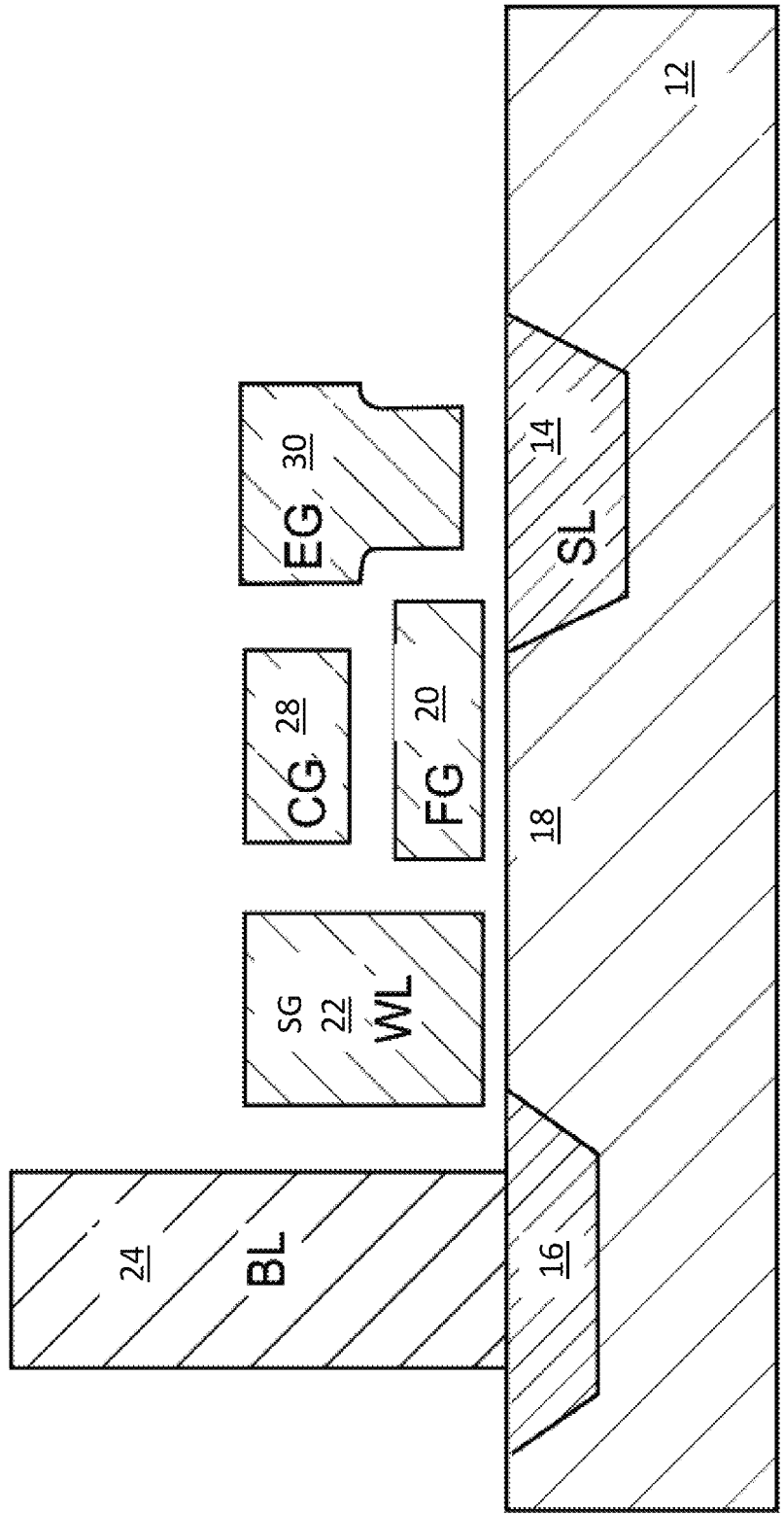
FIG. 2 depicts another prior art split gate flash memory cell.
Figure 3:
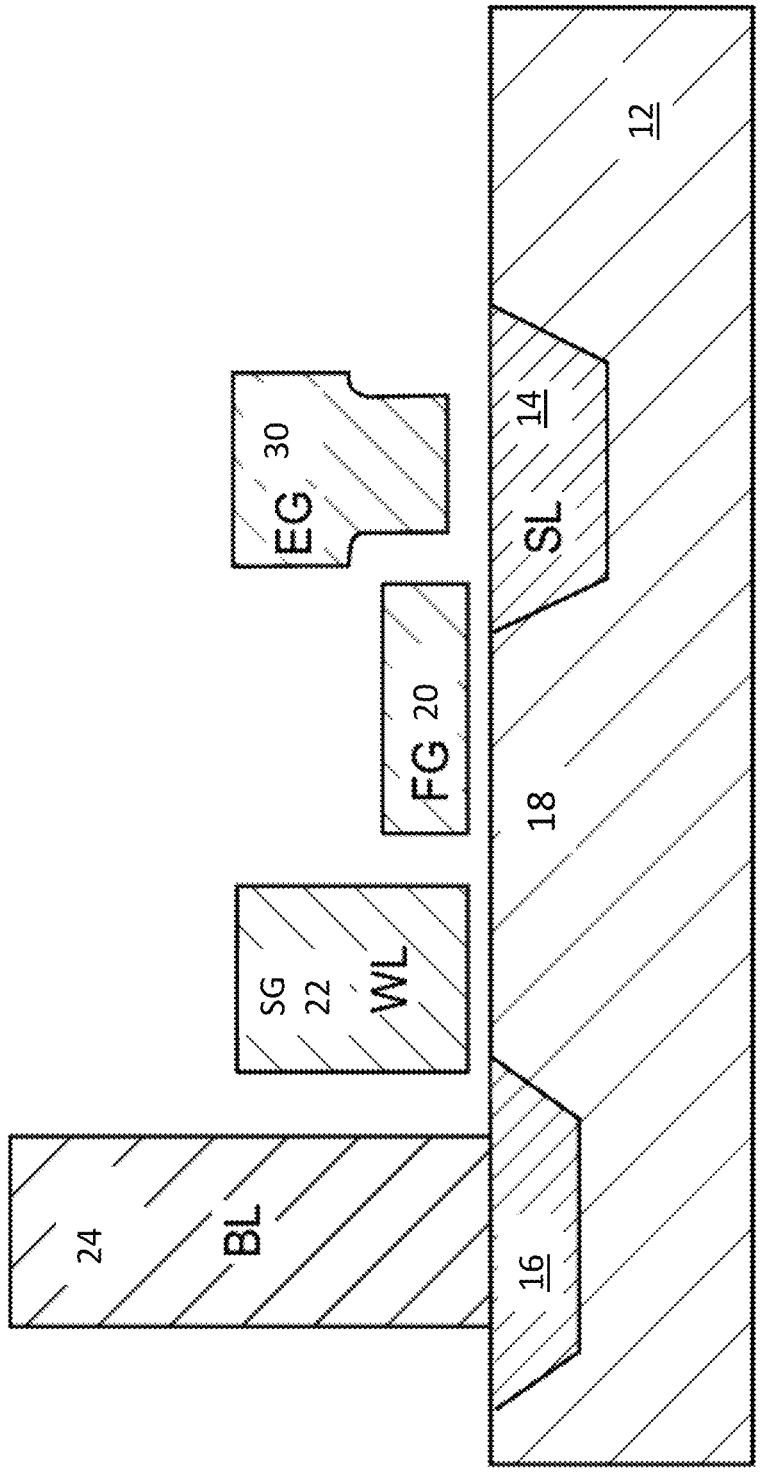
FIG. 3 depicts another prior art split gate flash memory cell.
Figure 4:
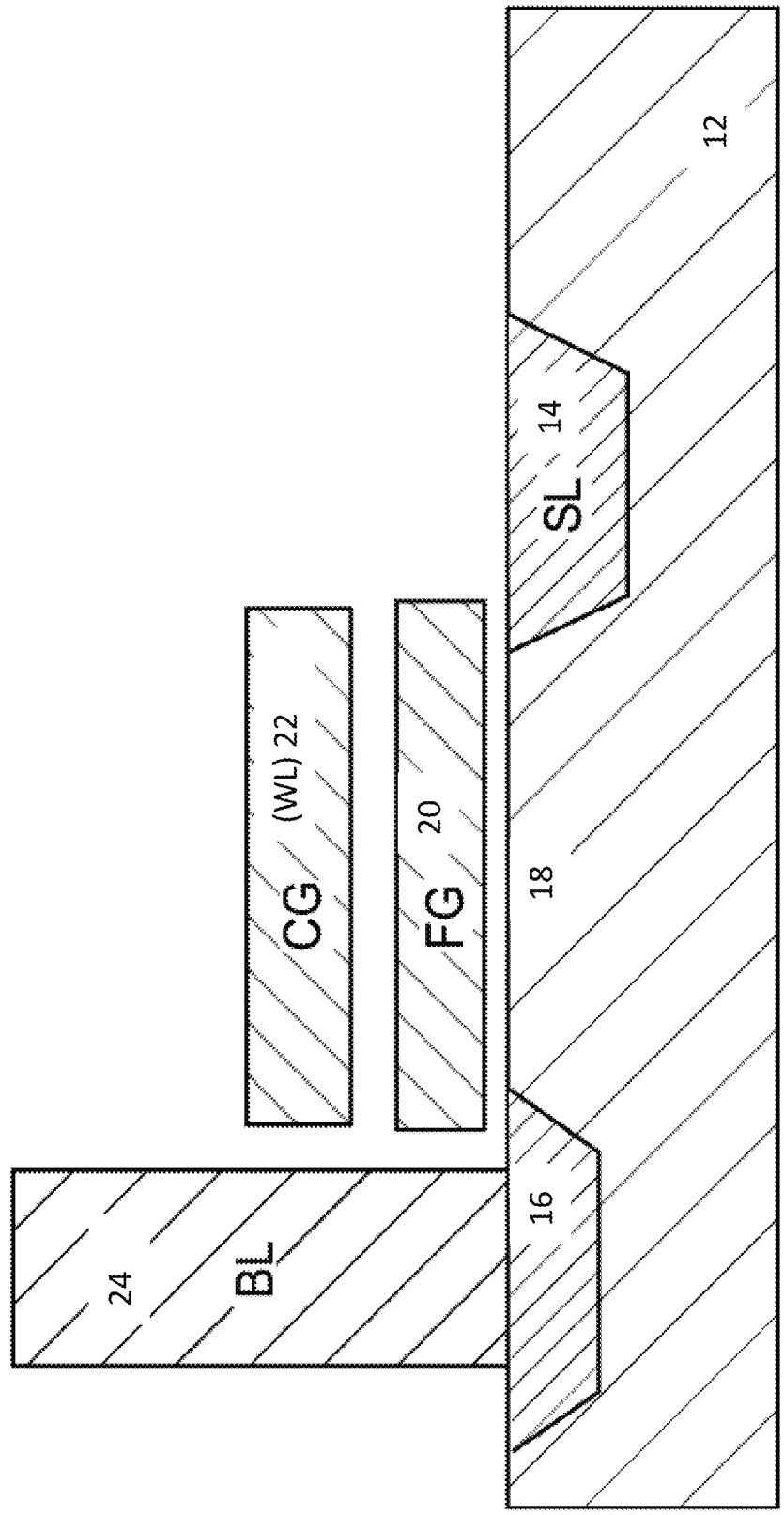
FIG. 4 depicts another prior art split gate flash memory cell.

Array 501 comprises a plurality of non-volatile memory cells arranged in rows and columns. Each non-volatile memory cell can be, for example, memory cell 110 in FIG. 1, memory cell 210 in FIG. 2, memory cell 310 in FIG. 3, memory cell 410 in FIG. 4, or any other type of non-volatile memory cell.

Row decoder 502 selects one or more rows in array 501 for a program, erase, or read operation.

High voltage decoder 503 couples a high voltage to one or more rows in array 501 during a program or erase operation.

Column decoder 504 is coupled to all columns in array 501 and comprises multiplexors for selecting one or more columns in array 501 during a read, program, or erase operation.

Bit line drivers 505 provide a voltage to one or more selected columns during a program or erase operation.

Control logic 506 implements a read, program, or erase operation.

Bias generator 507 generates low voltages (e.g., voltages less than or equal to the core voltage, Vdd, of non-volatile memory system 500) required for read, program and erase operations. High voltage generator 509 generates high voltages (e.g., voltages greater than the core voltage, Vdd) needed for program and erase operations through high voltage decoder 503.

Sense amplifier 508 senses the value stored in a selected cell in a selected column during a read operation.

The embodiments that follow can be used in high voltage generator 509 to reduce the power supply needed by high voltage generator 509 and/or to reduce the total power required by high voltage generator 509 compared to prior art high voltage generators.

Figure 6:
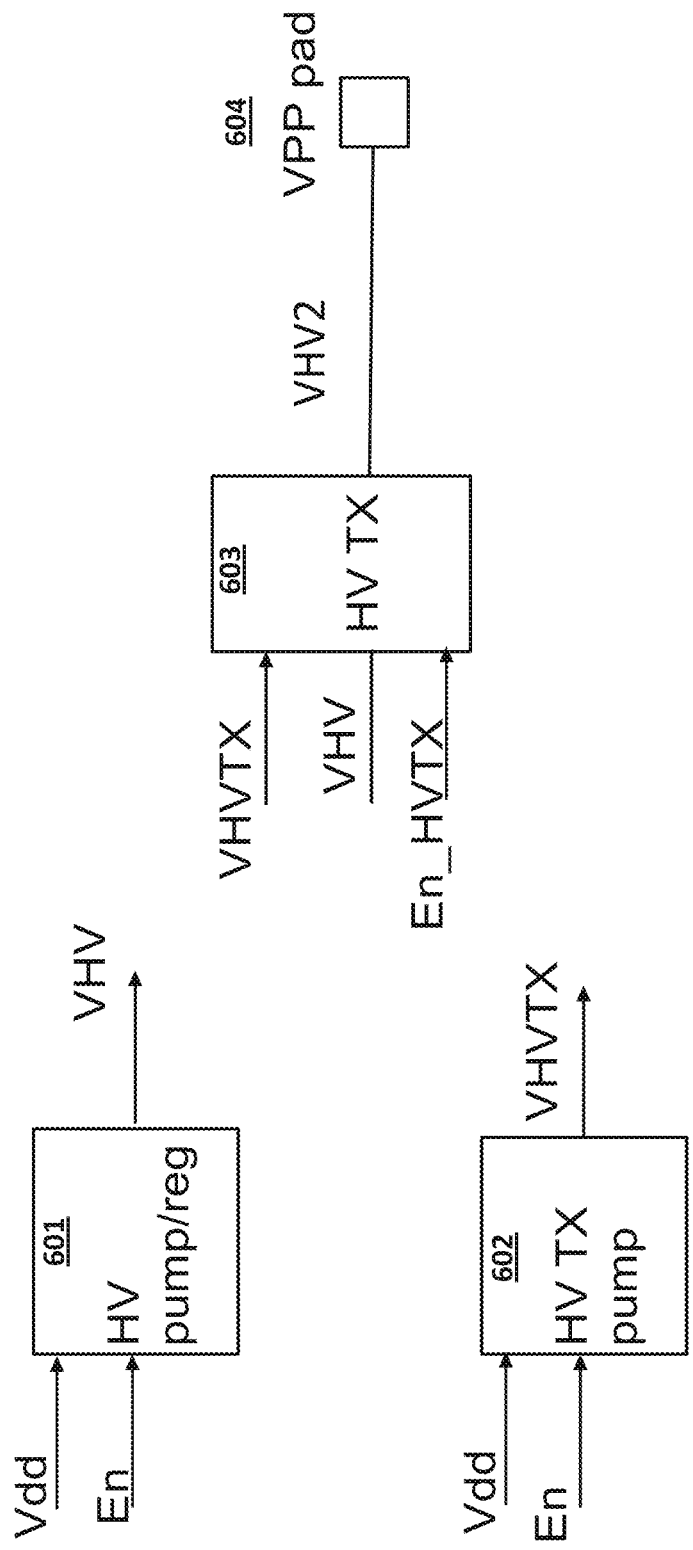
FIG. 6 depicts an example high voltage generator.

FIG. 6 depicts high voltage generator 600, which comprises high voltage pump and regulator 601, high voltage transceiver pump 602, high voltage transceiver 603, and pad 604.

High voltage pump and regulator 601 receives supply voltage Vdd and enable signal En and generates high voltage VHV, which is a higher voltage than Vdd (e.g., voltage VHV is a voltage in the range of 4V-13V, without limitation), as needed for program or erase operation. High voltage pump and regulator 601 can comprise, for example, one or more charge pumps, regulators, and/or one or more high voltage level shifters.

High voltage transceiver (HV TX) pump 602 receives supply voltage Vdd and enable signal EN and generates high voltage VHVTX, which is a higher voltage than Vdd, e.g., VHVTX is in the range of 6V-15V, without limitation, as needed for operation of HV transceiver 603. VHVTX is in general chosen to be greater than VHV.

High voltage transceiver pump 602 can comprise, for example, one or more charge pumps and/or one or more high voltage level shifters.

High voltage transceiver 603 receives high voltages VHV and VHVTX and high voltage transceiver enable signal, En_HVTX, and controllably outputs high voltage VHV2 (which high voltage VHV2 is selectably equal to high voltage VHV or VHVTX minus any threshold voltage drop incurred within high voltage transceiver 603) on VPP pad 604, or receives an external high voltage on VPP pad 604 and outputs that voltage on the internal VHV node for internal use. Receiving an external high voltage on VPP pad 604 and outputting that voltage on the internal VHV node is needed, for example, during various voltage stress tests (such as the oxide stress test) performed during manufacturing to screen for defects in array 501 or control logic 506. VPP pad 604 is an HV electrical terminal (e.g., HV pad or pin).

HV transceiver 603 can also monitor and/or measure the internal high voltages (i.e., high voltage VHV or VHVTX). For example, HV transceiver 603 can be used for trimming high voltage VHV to a target voltage, e.g., 11.5V for erase and 10.5V for programming, by adjusting a trim setting by applying a HV trim algorithm.

HV transceiver 603, in some examples, also provides high voltages during testing of array 501 such as mass testing. Mass testing is a process where multiple memory cells are tested in parallel to speed up testing time. For example, HV transceiver 603 may supply more power from an external high voltage supply via VPP pad 604 to replace, or supplement, internal HV charge pump circuits, which are limited in power. Hence, HV transceiver 603 allows for the chip to utilize external voltage sources during testing processes, which results in lower area overhead and less power compared to a situation where all of those voltages are generated on-chip.

Figure 7:
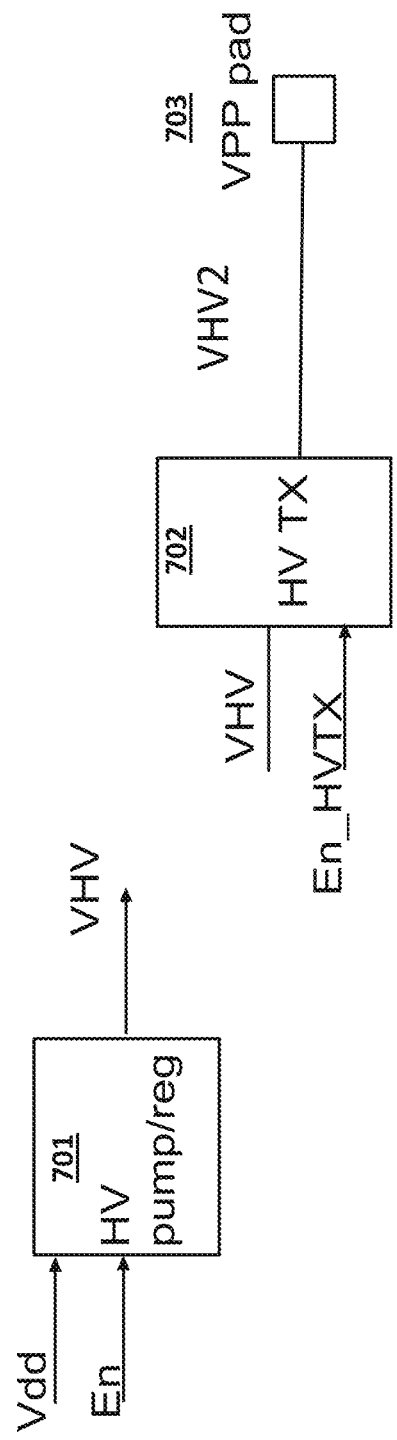
FIG. 7 depicts another example high voltage generator.

FIG. 7 depicts high voltage generator 700, which comprises high voltage pump and regulator 701, high voltage transceiver 702, and VPP pad 703. VPP pad 703 is an HV electrical terminal (e.g., an HV pad or pin).

High voltage pump and regulator 701 receives supply voltage Vdd and enable signal En and generates high voltage VHV, which is a voltage higher than voltage Vdd. High voltage pump and regulator 701 can comprise, for example, one or more charge pumps and/or one or more high voltage level shifters.

High voltage transceiver 702 receives high voltage VHV from high voltage pump and regulator 701 and a high voltage transceiver enable signal, En_HVTX. High voltage transceiver 702 can receive high voltage VHV and output high voltage VHV2 on VPP pad 703, or it can receive a high voltage generated externally and provided on VPP pad 703 and output that voltage on the internal VHV node (shown on the left of high voltage transceiver 702 in FIG. 7)

Figure 8A:
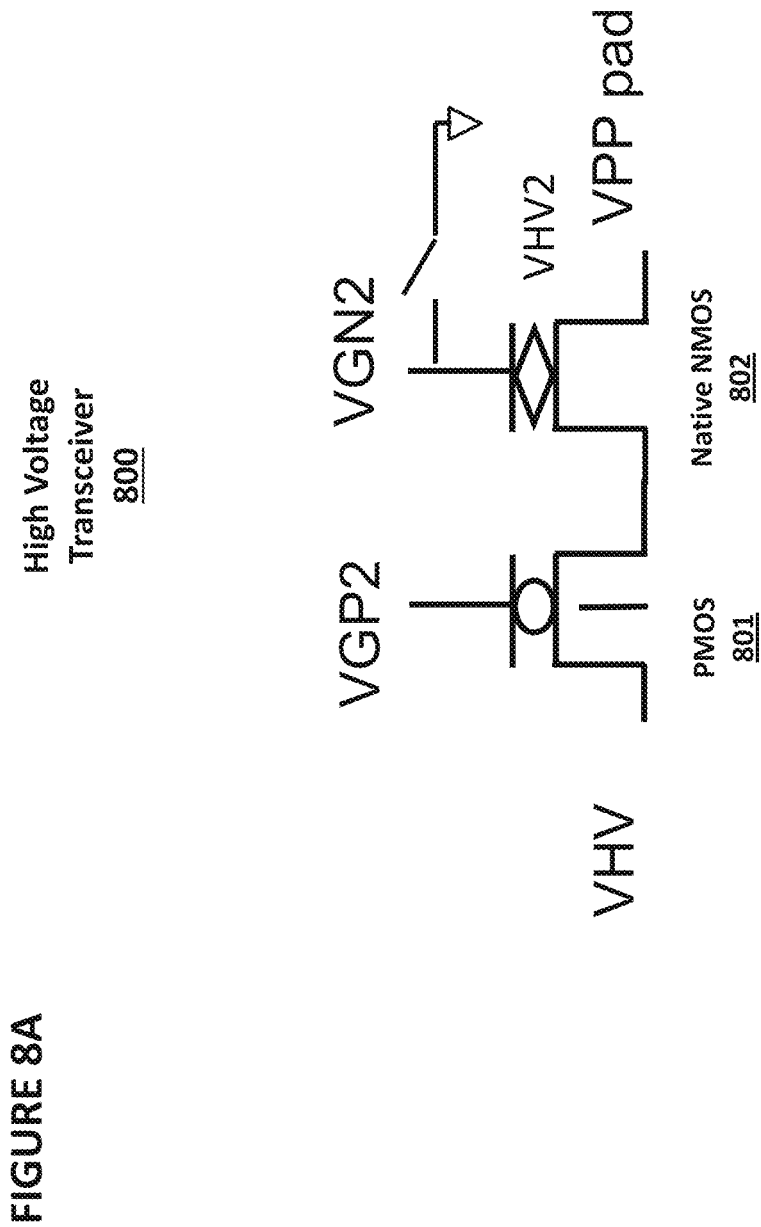
FIG. 8A depicts a high voltage transceiver.

FIG. 8A depicts high voltage transceiver 800, which can be used for high voltage transceiver 603 in FIG. 6 or high voltage transceiver 702 in FIG. 7. High voltage transceiver 800 comprises PMOS transistor 801 and native NMOS transistor 802, arranged in a series configuration as shown, so that a first terminal of PMOS transistor 801 is coupled to a first node 803, which is shown as receiving high voltage VHV, a second terminal of PMOS transistor 801 is coupled to a first terminal of native NMOS transistor 802 at node 804, and a second terminal of native NMOS transistor 802 is coupled to a second node 805, denoted VPP pad. PMOS transistor 801 receives high voltage VHV on its input, i.e. its first terminal, and native NMOS transistor 802 outputs high voltage VHV2 at the second node, VPP pad, which can be VPP pad 604 in FIG. 6 or VPP pad 703 in FIG. 7. PMOS transistor 801 and NMOS transistor 802 are arranged in a cascading configuration, where there is high input-output isolation. High voltage VHV may also be called a first high voltage and high voltage VHV2 may also be called a second high voltage.

High voltage VHV might be, for example, 12V. PMOS transistor 801 receives a voltage VGP2 on its gate, which will be near an intermediate voltage (e.g., <VHV) such as Vdd (e.g., 1.8V, which represents a "0") when PMOS transistor 801 is to conduct (since source/drain is high voltage VHV, which is 12V in this example, and VTP (threshold voltage) of PMOS transistor 801 is typically <1V). The use of such a voltage (Vdd in this case) on the gate of PMOS transistor 801 reduces voltage stress across the PMOS 801 (e.g., by 1.8V, meaning stress voltage=12V−1.8V).

Native NMOS transistor 802 receives voltage VGN2 on its gate. Native NMOS transistor 802 will conduct when VGN2 exceeds the source voltage (which will be around high voltage VHV) by the threshold voltage, VTN, of native NMOS transistor 802. For example, if VTN with body effect is 0.7V, then native NMOS transistor 802 will conduct when VGN2 is 12.7V. When it is desired for native NMOS transistor 802 to not conduct, or for high voltage transceiver 800 to be not enabled, then the gate of native NMOS transistor 802 can be connected to ground.

When high voltage transceiver 800 is enabled by VGP2 and VGN2, the high voltage VHV2 on VPP pad is about equal to the high voltage once VHV>VGP2 (=Vdd in this example)+VTP (due to turn on voltage of the PMOS). In this case, enabling high voltage transceiver 800 is done by setting VGP2=Vdd or 0V, VGN2=>12.7V. When high voltage transceiver 800 is disabled, in this case by setting VGP2=VHV or connecting the gate of native NMOS 802 to ground, or setting VGN2 to an intermediate voltage such as Vdd, the voltage on VPP pad is floating.

In another embodiment, the gate of PMOS transistor 801 can receive ground (0V) instead of VGP2.

Figure 8B:
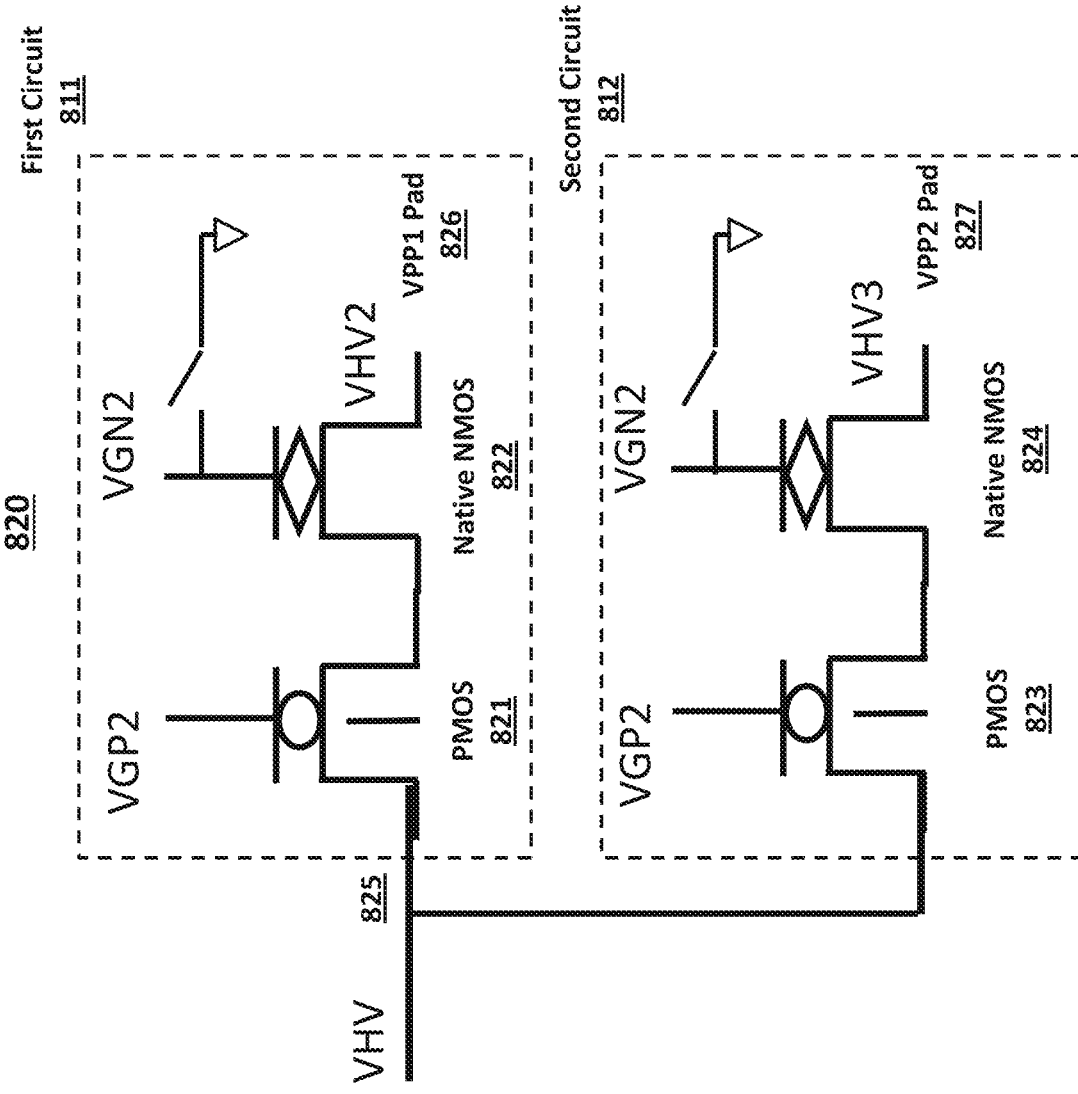
FIG. 8B depicts force-sense high voltage transceiver.

FIG. 8B depicts high voltage transceiver 820, which comprises first circuit 811 and second circuit 812. For example, the first circuit 811 can be used for sensing the voltage VHV on the node 825 at VPP1 pad 826 and the second circuit 812 can be used for forcing a voltage from VPP2 pad 827 into the node 825.

First circuit 811 comprises PMOS 821 and native NMOS 822, which are similar in function to the PMOS 801 and native NMOS 802 in FIG. 8A. In one mode, the input to first circuit 811 is VHV on node 825 and the output is high voltage VHV2 on VPP1 pad 826. In another mode, the input to first circuit 811 is a high voltage generated externally and provided on VPP1 pad 826, and the output is a high voltage provided on node 825.

Second circuit 812 comprises PMOS 823 and native NMOS 824, which are similar in function to the PMOS 821 and the native NMOS 822. In one mode, the input to second circuit 812 is high voltage VHV on node 825 and the output is high voltage VHV3 on VPP2 pad 827. In another mode, the input to first circuit 812 is a high voltage generated externally and provided on VPP2 pad 827, and the output is a high voltage provided on node 825.

During operation, one of first circuit 811 and second circuit 812 is used to provide a high voltage from VPP1, VPP2 pad 826 or 827, respectively, to node 825, and the other of first circuit 811 and second circuit 812 provides the high voltage from node 825 to its respective VPP1, VPP2 pad. In other words, the voltage from one of VPP1, VPP2 pad 826 or 827 is forced on to node 825, and the other one of VPP1, VPP2 pad 826 or 827 may be used to sense the voltage on node 825.

Figure 9:
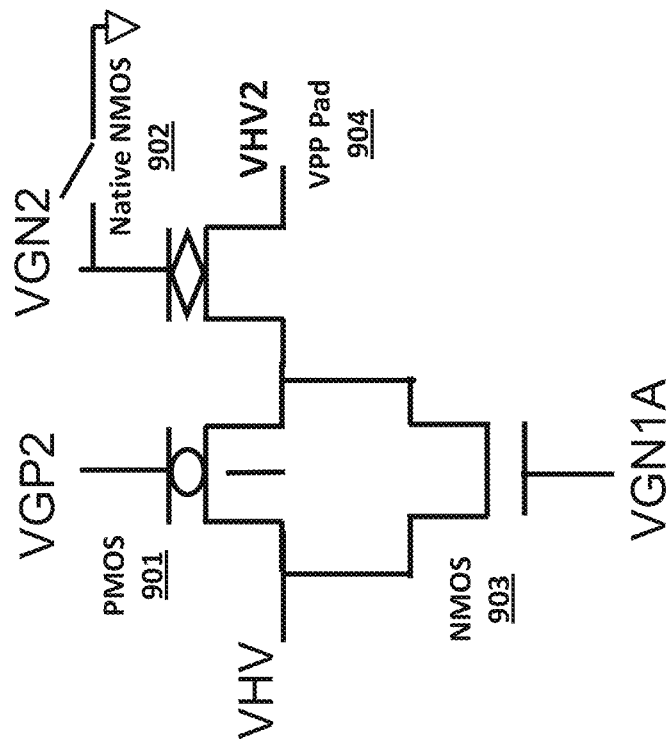
FIG. 9 depicts another example high voltage transceiver.

FIG. 9 depicts high voltage transceiver 900, which can be used for high voltage transceiver 603 in FIG. 6 or high voltage transceiver 702 in FIG. 7. The high voltage transceiver 900 behaves similarly as the high voltage transceiver 800 of FIG. 8A. High voltage transceiver 900 comprises PMOS transistor 901, native NMOS transistor 902, and NMOS transistor 903, arranged in a cascoding configuration as shown, where there is high input-output isolation. PMOS transistor 901 and NMOS transistor 903 receive high voltage VHV, as an input, and native NMOS transistor 902 outputs a high voltage VHV2 on its output node, VPP pad 904, which can be VPP pad 604 in FIG. 6 or VPP pad 703 in FIG. 7.

High voltage VHV might be, for example, 12V. PMOS transistor 901 receives voltage VGP2 on its gate, which is set to be near Vdd when PMOS transistor 901 is to conduct. NMOS transistor 903, which is connected in parallel to PMOS transistor 901, receives voltage VGN1A on its gate, which will require a high voltage of VHV+VT (the threshold voltage of NMOS transistor 903) to conduct. Native NMOS transistor 902 receives voltage VGN2 on its gate. When it is desired for native NMOS transistor 902 to not conduct, or for high voltage transceiver 900 to be not enabled, then the gate of native NMOS transistor 902 can be connected to ground. Native NMOS transistor 902 will conduct when voltage VGN2 exceeds the source voltage (which will be around VHV) by the threshold voltage, VTN, of native NMOS transistor 902. For example, if the threshold voltage VTN is 0.7V, then native NMOS transistor 902 will conduct when VGN2 is 12.7V. NMOS 903 is used to pass voltage VHV when high voltage VHV<VGP2+VTP, in which case PMOS 901 will not be on.

In another embodiment, the transceiver 900 can have another circuit path of PMOS, NMOS, native NMOS in parallel as described above in relation to FIG. 8B to perform a force and sense function.

Figure 10:
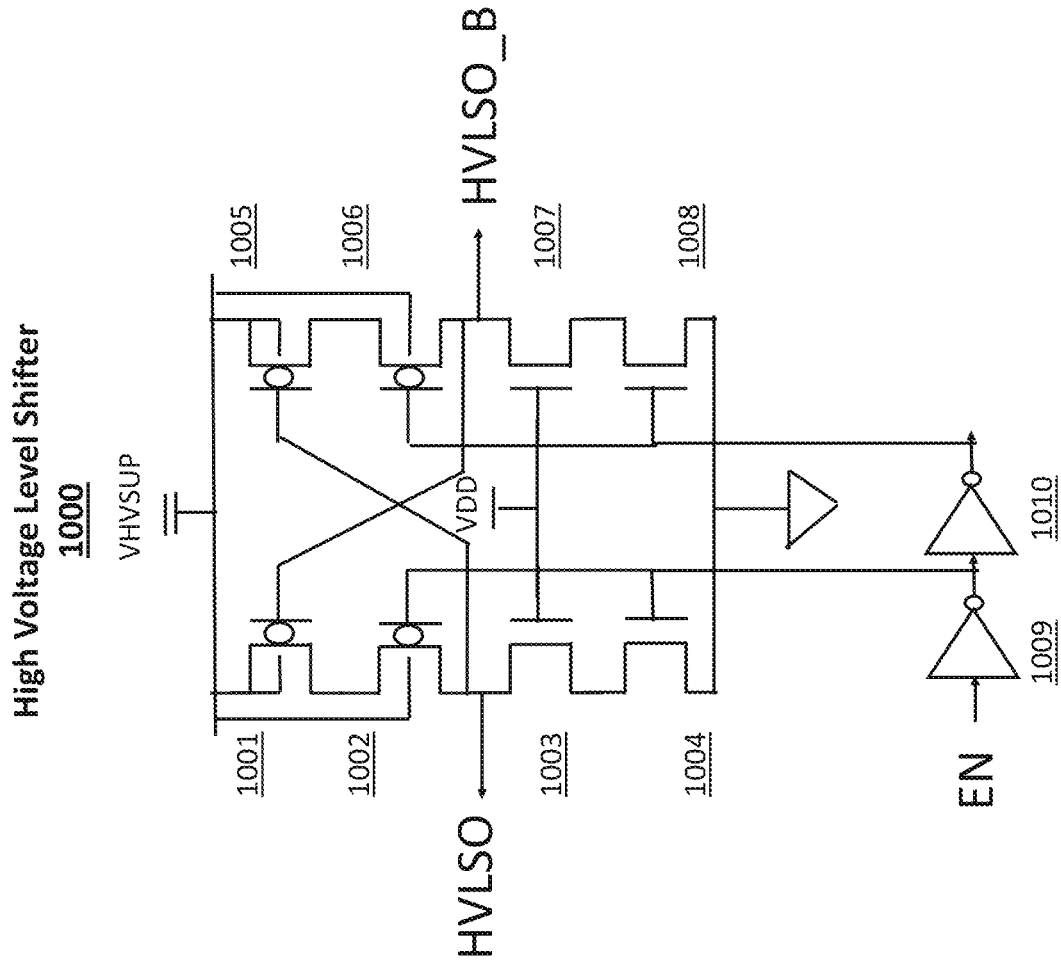
FIG. 10 depicts an example high voltage level shifter.

FIG. 10 depicts high voltage level shifter (HV LS) 1000, which can be used in high voltage pump and regulators 601 and 701 and high voltage transceiver pump 602. The HV LS 1000 outputs either high voltage VHV or ground on output nodes HVLSO or HVLSO_B, responsive to the state of signal EN.

High voltage level shifter 1000 comprises inverters 1009 and 1010; NMOS transistors 1003, 1004, 1007, and 1008; and PMOS transistors 1001, 1002, 1005, and 1006, in the configuration shown.

High voltage level shifter 1000 receives signal EN as an input (where a "0" is ground and a "1" is Vdd) and outputs voltages HVLSO and its complement, HVLSO_B, which can have voltage levels equal to VHVSUP, (e.g., 12V), where HVLSO and its complement, HVLSO_B have a larger voltage swing than signal EN. For example, when EN is "1," its voltage will be Vdd. HVLSO also will be "1," and its voltage will be VHVSUP (e.g., 12 V) and HVLSO_B will be ground. Similarly, when EN is "0," its voltage will be ground. HVLSO also will be "ground" and HVLSO_B will be VHVSUP (e.g., 12 V).

Figure 11:
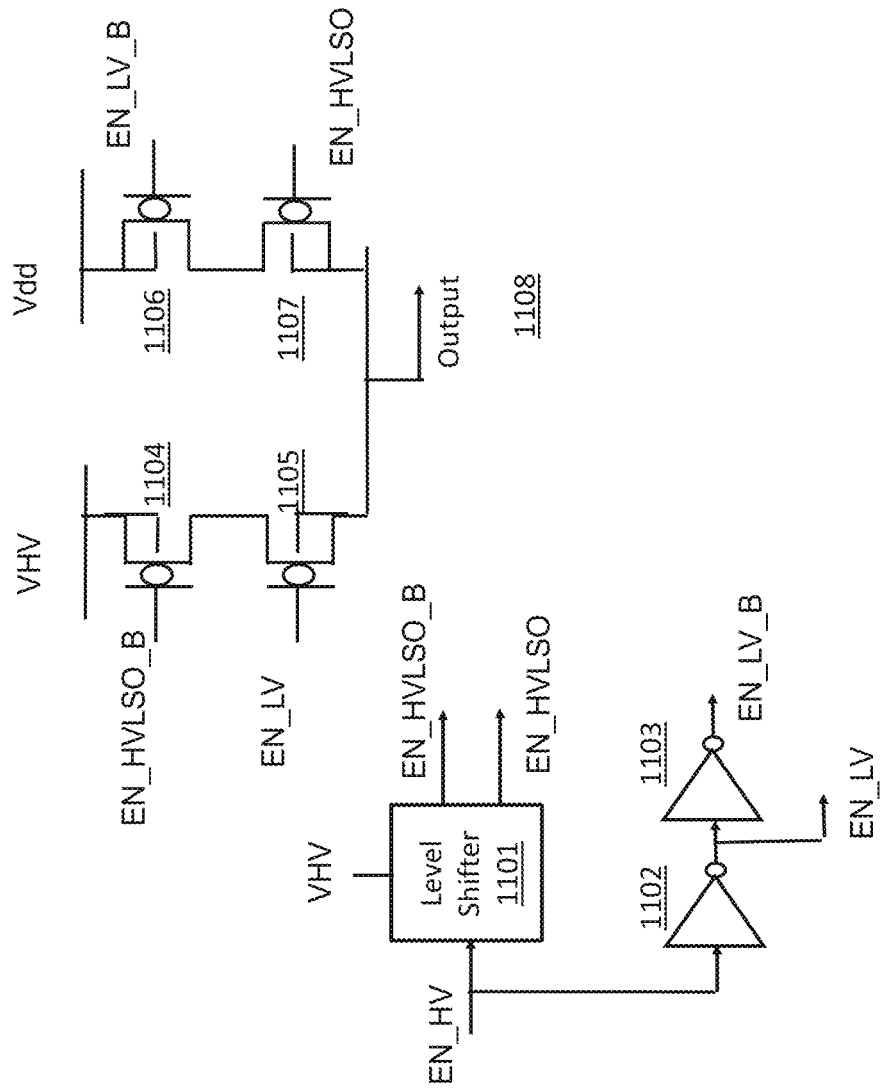
FIG. 11 depicts another example high voltage level shifter.

FIG. 11 depicts high voltage level shifter (HV LS) 1100, which can be used in high voltage pump and regulators 601 and 701 and high voltage transceiver pump 602. High voltage level shifter 1100 comprises inverters 1102 and 1103, level shifter 1101, and PMOS transistors 1104, 1105, 1106, and 1107, in the configuration shown. The HV LS 1100 outputs either high voltage VHV or Vdd on output node 1108.

Level shifter 1100 receives EN_HV as an input and outputs EN_HVLSO and its complement, EN_HVLSO_B, which can have voltage level equal to VHVSUP, (e.g., 12V), which have a larger voltage swing than EN. For example, when EN='1', EN_HVLSO will also='1', =VHVSUP (e.g., 12V) and will have a high voltage than EN. Level shifter 1101 optionally can comprise high voltage level shifter 1000 from FIG. 10. Inverters 1102 and 1103 generate signals EN_LV and EN_LV_B as shown.

When EN_HV is high: EN_LV will be low, EN_LV_B will be high, EN_HVLSO will be high, and EN_HVLSO_B will be low, resulting in PMOS transistors 1104 and 1105 turning on and PMOS transistors 1106 and 1107 turning off. As a result, Output node 1108=high voltage VHV.

When EN_HV is low: EN_LV will be high, EN_LV_B will be low, EN_HVLSO will be low, and EN_HVLSO_B will be high, resulting in PMOS transistors 1104 and 1105 turning off and PMOS transistors 1106 and 1107 turning on. As a result, Output node 1108=Vdd.

Figure 12:
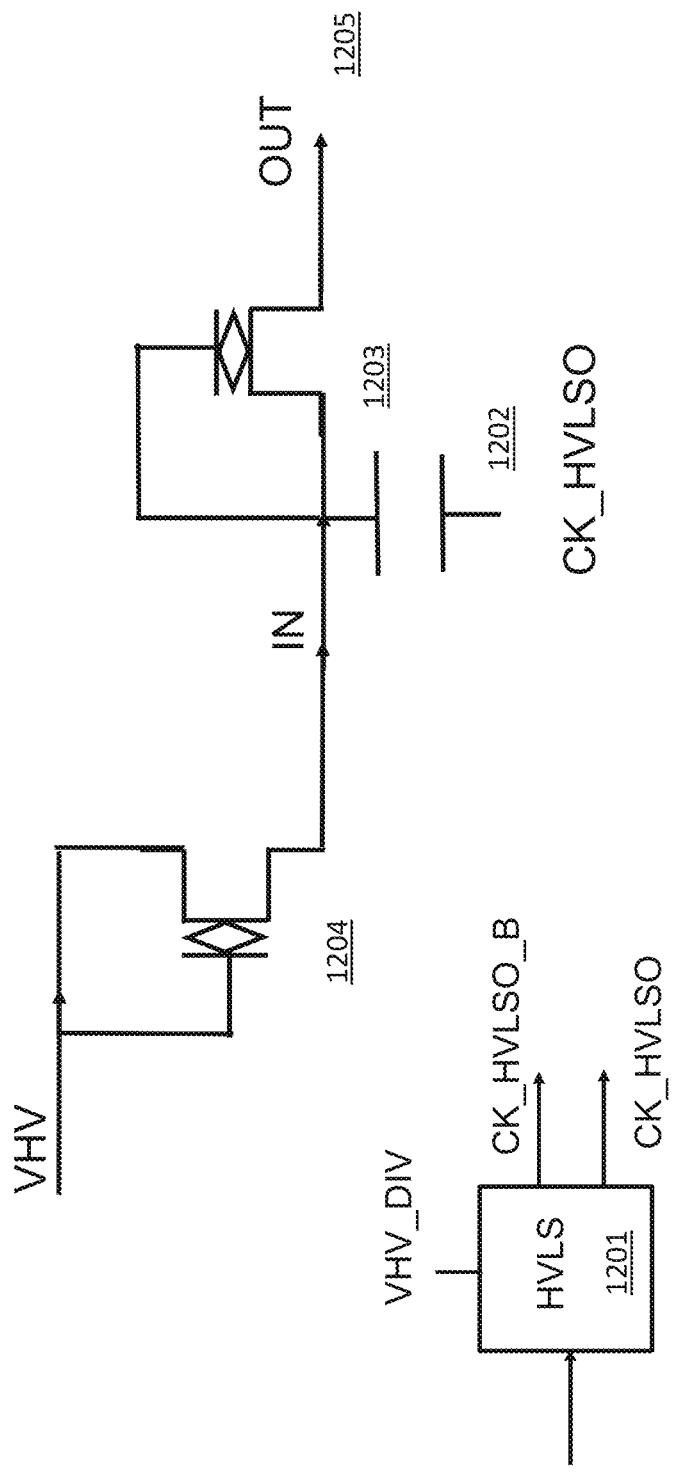
FIG. 12 depicts an example high voltage transceiver charge pump.

FIG. 12 depicts a high voltage transceiver charge pump (HVTXCP) 1200. High voltage transceiver charge pump 1200 receives input as high voltage VHV and generates voltage OUT at node 1205. Native NMOS transistor 1204 is connected in a diode formation. Input high voltage VHV is applied to the gate/drain of native NMOS transistor 1204, hence VHV-VTN is the resulting voltage on its source as internal voltage IN.

A high voltage clock signal, CK_HVLSO, and its complement CK_HVLSO_B is generated by high voltage level shifter 1201. CK_HVLSO is applied to one lead of capacitor 1202, which pumps the internal voltage IN by the amount of CK_HVLSO during a high cycle. That voltage is received by native NMOS transistor 1203, connected in a diode formation, to generate voltage OUT at node 1205, which is equal to (VHV−VTN)+V(CK_HSLSO)−VTN. V(CK_HVLSO) is the voltage of the signal CK_HVLSO, which may be a divided voltage from high voltage VHV, denoted VHV_DIV.

For example, if high voltage VHV=12V, VHV_DIV=4V, and VTN=0.7V, then output voltage OUT on node 1205=14.6V. HVTXCP 1200 may be used to supply the high level>VHV+VTN for the signal VGN2 for the circuit 800 and 900.

The capacitor 1202 and the diode connected NMOS 1203 constitutes one charge pump stage. Only one charge pump stage is needed since the HVTXCP 1203 has input as high voltage VHV and the pump clock has its supply VHV_DIV. Namely, it has high voltage VHV as its supply and input to generate an output voltage>VHV+VTN. Optionally, there could be a plurality of charge pump stages.

Figure 13:
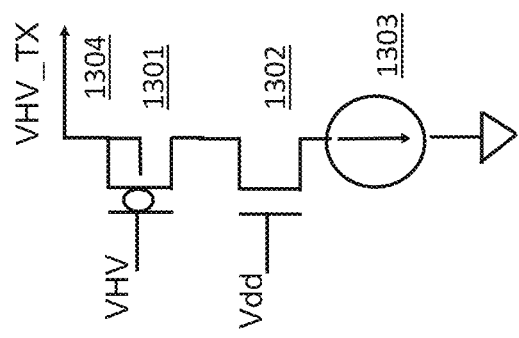
FIG. 13 depicts an example high voltage transceiver regulator.

FIG. 13 depicts high voltage transceiver regulator (HVTXREG) 1300, which comprises PMOS transistor 1301, NMOS transistor 1302, and current source 1303. PMOS 1301 and NMOS transistor 1302 are arranged in a cascading configuration to provide high input-output isolation to buffer the high voltage VHV_TX from current source bias 1303. NMOS transistor receives Vdd on its gate, and PMOS transistor 1301 receives high voltage VHV on its gate. HVTXREG 1300 clamps voltage on the source of the PMOS 1301, i.e. the voltage VHV_TX, at VHV+VTP since at this voltage or higher, the PMOS 1301 will turn on and therefore sink the current from VHV_TX to the NMOS 1302 and from there to ground by the current source 1303. This circuit may be used to regulate for example the output of the HVTXCP 1200 to VHV+VTP. There could be a plurality of diodes (such as diode connected PMOS transistors) from the supply node of VHV_TX to the source of the PMOS 1301 to increase the regulated high voltage on VHV_TX node, for example=VHV+2*VTP.

Figure 14:
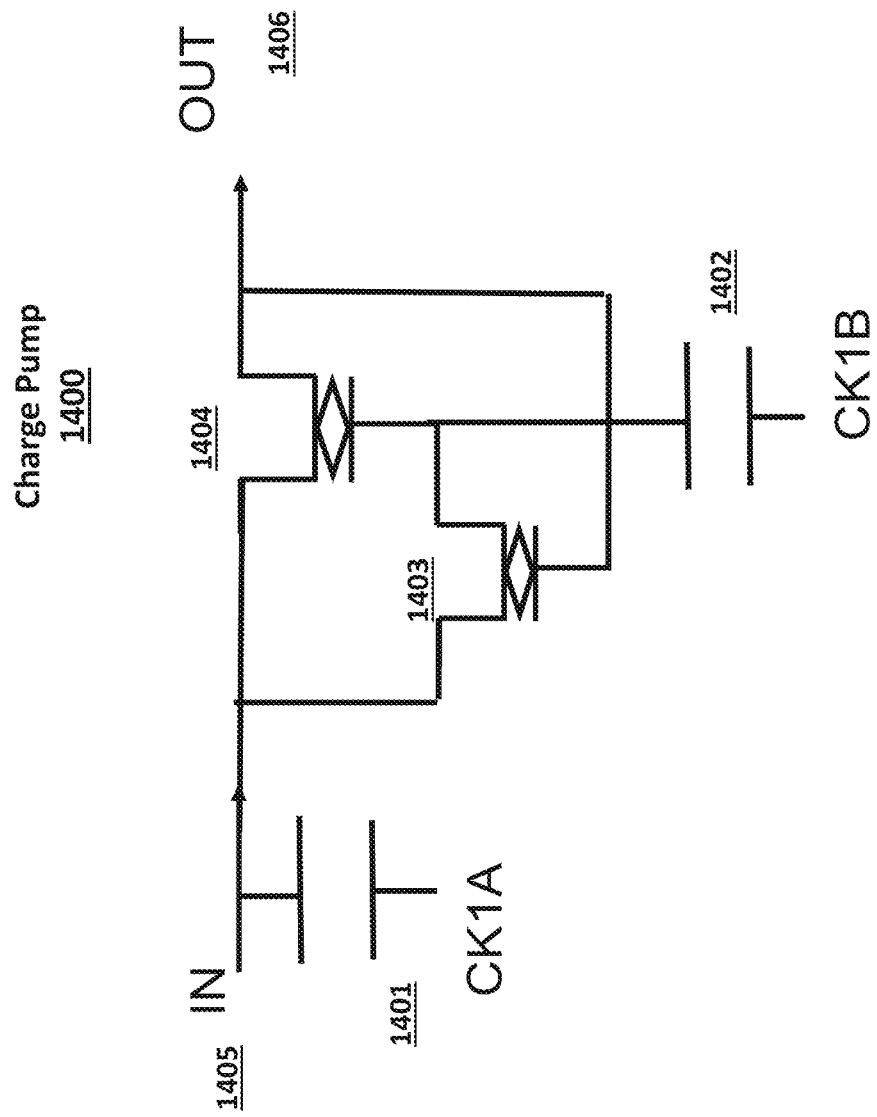
FIG. 14 depicts an example charge pump stage.

FIG. 14 depicts charge pump stage 1400, which can be used as a charge pump stage in HVTXCP in FIG. 12. The charge pump stage 1400 comprises capacitors 1401 and 1402 and native NMOS transistors 1403 and 1404 to make up a VT-canceling charge pump stage. Pumping capacitor 1401 is coupled to clock signal, CK1A, on one terminal, and to the input 1405, IN, on another terminal. Boost capacitor 1402 is coupled to clock signal, CK1B, on one terminal, and to the gate of pass transistor native NMOS transistor 1404 on another terminal. The drain and source of the native NMOS 1404 are coupled to the input 1405, IN, on one terminal and the output 1406, OUT, on another terminal. The source and drain of the native NMOS 1403 are coupled to the input 1405, IN, on one terminal and the gate of the NMOS 1404 on the other terminal. The gate of native NMOS 1403 is coupled to output 1406, OUT. CK1B is the inverse of CK1A.

During operation, clock signals CK1A and CK1B oscillate out of phase 90 degrees with one another. The voltage at output 1406, OUT, will be pumped to a voltage equal to voltage at IN 1405 plus the peak voltage of CK1A.

Figure 15:
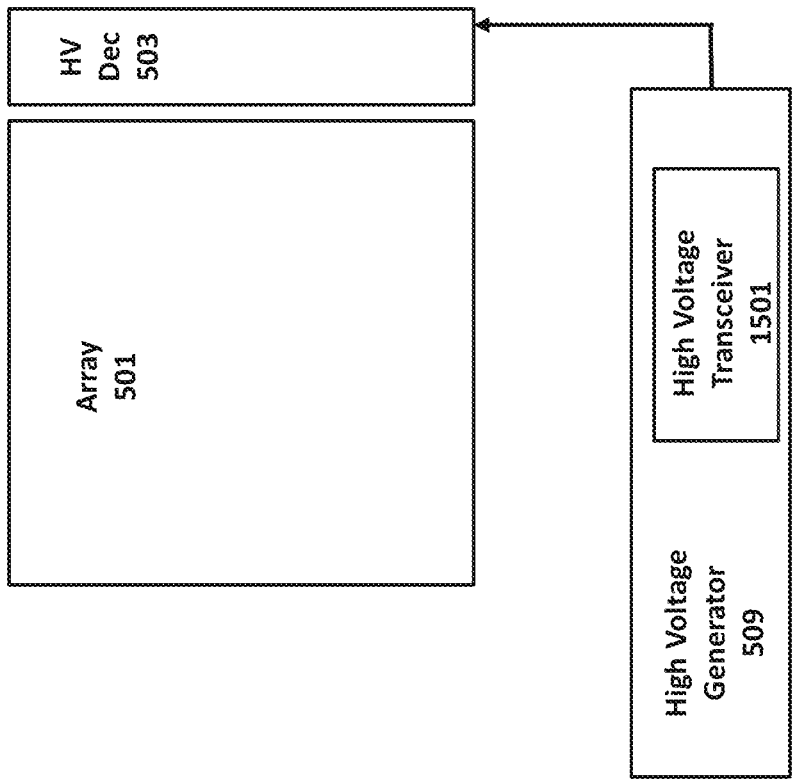
FIG. 15 depicts a non-volatile memory system comprising a high voltage transceiver.

FIG. 15 depicts non-volatile memory system 1500, which is similar to non-volatile memory system 500 of FIG. 5 but includes high voltage transceiver 1501 as part of high voltage generator 509. High voltage transceiver 1501 can be one of the high voltage transceivers discussed above, such as high voltage transceivers 603, 702, 800, 820, and 900. High voltage transceiver 1501 provides a high voltage to high voltage decoder 503, which then applies the high voltage to one or more selected cells in array 501 during an erase or program operation.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A transceiver for a non-volatile memory system, comprising:
    a PMOS transistor comprising a first terminal coupled to a first node, a second terminal, and a gate; and
    a native NMOS transistor comprising a first terminal coupled to the second terminal of the PMOS transistor, a second terminal coupled to a second node, and a gate;
    wherein the transceiver can provide a first high voltage on the first node in response to receiving a second high voltage on the second node and can provide a third high voltage on the second node in response to receiving a fourth high voltage on the first node, the first high voltage equal to the second high voltage and the third high voltage equal to the fourth high voltage.

2. The transceiver of claim 1, wherein the gate of the PMOS transistor receives a voltage smaller in magnitude than the first high voltage.

3. The transceiver of claim 1, wherein the output signal of the transceiver is coupled to the non-volatile memory system for use in erase or program operations of the non-volatile memory system.

4. The transceiver of claim 1, wherein the gate of the native NMOS transistor is connected to ground when the transceiver is disabled.

5. The transceiver of claim 1, further comprising a charge pump.

6. The transceiver of claim 1, further comprising a second PMOS transistor and a second native NMOS transistor forming a circuit path between the first node and the second node.

7. A transceiver for a non-volatile memory, comprising:
    a PMOS transistor comprising a first terminal, a second terminal, and a gate;
    an NMOS transistor comprising a first terminal coupled to the first terminal of the PMOS transistor coupled to a first node, a second terminal, and a gate; and
    a native NMOS transistor comprising a first terminal coupled to the second terminal of the PMOS transistor and the second terminal of the NMOS transistor, a second terminal coupled to a second node, and a gate;
    wherein the transceiver can provide a first high voltage on the first node in response to receiving a second high voltage on the node and the second node and can provide a third high voltage on the second node in response to receiving a fourth high voltage on the first node, the first high voltage equal to the second high voltage and the third high voltage equal to the fourth high voltage.

8. The transceiver of claim 7, wherein the first high voltage is used during erase or program operations in the flash memory.

9. The transceiver of claim 7, wherein the gate of the PMOS transistor receives a voltage smaller in magnitude than the first high voltage.

10. The transceiver of claim 7, wherein the gate of the native NMOS transistor is connected to ground when the transceiver is disabled.

11. The transceiver of claim 7, further comprising a charge pump.

12. The transceiver of claim 7, further comprising a second PMOS transistor and a second native NMOS transistor forming a circuit path.

\* \* \* \* \*